(12) United States Patent
Kim et al.

(10) Patent No.: US 8,294,276 B1
(45) Date of Patent: Oct. 23, 2012

(54) SEMICONDUCTOR DEVICE AND FABRICATING METHOD THEREOF

(75) Inventors: Sang Won Kim, Seoul (KR); Boo Yang Jung, Seoul (KR); Sung Kyu Kim, Seoul (KR); Min Yoo, Seoul (KR); Seung Jae Lee, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 106 days.

(21) Appl. No.: 12/788,845

(22) Filed: May 27, 2010

(51) Int. Cl.
*H01L 23/12* (2006.01)
(52) U.S. Cl. . 257/775; 257/773; 257/787; 257/E23.012; 257/E23.015; 257/E23.019; 257/E23.02
(58) Field of Classification Search ............... 257/737, 257/773, 775, 787, E23.011, E23.012, E23.015, 257/E23.019, E23.02, 724
See application file for complete search history.

(56) References Cited

U.S. PATENT DOCUMENTS

| | | | |
|---|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 3,868,724 A | 2/1975 | Perrino |
| 3,916,434 A | 10/1975 | Garboushian |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,322,778 A | 3/1982 | Barbour et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,532,419 A | 7/1985 | Takeda |
| 4,541,003 A | 9/1985 | Otsuka et al. |
| 4,642,160 A | 2/1987 | Burgess |
| 4,645,552 A | 2/1987 | Vitriol et al. |
| 4,646,710 A | 3/1987 | Schmid et al. |
| 4,685,033 A | 8/1987 | Inoue |
| 4,706,167 A | 11/1987 | Sullivan |
| 4,707,724 A | 11/1987 | Suzuki et al. |

(Continued)

FOREIGN PATENT DOCUMENTS

DE 197 34 794 7/1998

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Allan R Wilson
(74) *Attorney, Agent, or Firm* — McKay and Hodgson, LLP; Serge J. Hodgson

(57) ABSTRACT

A semiconductor device and a fabricating method thereof are provided. In one exemplary embodiment, a plurality of semiconductor dies are mounted on a laminating member, for example, a copper clad lamination, having previously formed conductive patterns, followed by performing operations of encapsulating, forming conductive vias, forming a solder resist and sawing, thereby fabricating a chip size package in a simplified manner. Fiducial patterns are further formed on the laminating member, thereby accurately positioning the semiconductor dies at preset positions of the laminating member.

18 Claims, 9 Drawing Sheets

U.S. PATENT DOCUMENTS

| | | | |
|---|---|---|---|
| 4,716,049 A | 12/1987 | Patraw | |
| 4,727,633 A | 3/1988 | Herrick | |
| 4,729,061 A | 3/1988 | Brown | |
| 4,737,839 A | 4/1988 | Burt | |
| 4,756,080 A | 7/1988 | Thorp, Jr. et al. | |
| 4,786,952 A | 11/1988 | MacIver et al. | |
| 4,806,188 A | 2/1989 | Rellick | |
| 4,811,082 A | 3/1989 | Jacobs et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,897,338 A | 1/1990 | Spicciati et al. | |
| 4,905,124 A | 2/1990 | Banjo et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,964,212 A | 10/1990 | Deroux-Dauphin et al. | |
| 4,974,120 A | 11/1990 | Kodai et al. | |
| 4,987,475 A | 1/1991 | Schlesinger et al. | |
| 4,996,391 A | 2/1991 | Schmidt | |
| 5,018,003 A | 5/1991 | Yasunaga et al. | |
| 5,021,047 A | 6/1991 | Movern | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,072,075 A | 12/1991 | Lee et al. | |
| 5,072,520 A | 12/1991 | Nelson | |
| 5,081,520 A | 1/1992 | Yoshii et al. | |
| 5,087,961 A | 2/1992 | Long et al. | |
| 5,091,341 A | 2/1992 | Asada et al. | |
| 5,091,769 A | 2/1992 | Eichelberger | |
| 5,096,852 A | 3/1992 | Hobson | |
| 5,108,553 A | 4/1992 | Foster et al. | |
| 5,110,664 A | 5/1992 | Nakanishi et al. | |
| 5,118,298 A | 6/1992 | Murphy | |
| 5,122,860 A | 6/1992 | Kikuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,175,060 A | 12/1992 | Enomoto et al. | |
| 5,191,174 A | 3/1993 | Chang et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,229,550 A | 7/1993 | Bindra et al. | |
| 5,239,448 A | 8/1993 | Perkins et al. | |
| 5,247,429 A | 9/1993 | Iwase et al. | |
| 5,250,841 A | 10/1993 | Sloan et al. | |
| 5,250,843 A | 10/1993 | Eichelberger | |
| 5,252,853 A | 10/1993 | Michii | |
| 5,258,094 A | 11/1993 | Furui et al. | |
| 5,266,834 A | 11/1993 | Nishi et al. | |
| 5,268,310 A | 12/1993 | Goodrich et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,278,726 A | 1/1994 | Bernardoni et al. | |
| 5,279,029 A | 1/1994 | Burns | |
| 5,281,849 A | 1/1994 | Singh Deo et al. | |
| 5,283,459 A | 2/1994 | Hirano et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,353,498 A | 10/1994 | Fillion et al. | |
| 5,358,905 A | 10/1994 | Chiu | |
| 5,365,106 A | 11/1994 | Watanabe | |
| 5,371,654 A | 12/1994 | Beaman et al. | |
| 5,379,191 A | 1/1995 | Carey et al. | |
| 5,381,042 A | 1/1995 | Lerner et al. | |
| 5,391,439 A | 2/1995 | Tomita et al. | |
| 5,394,303 A | 2/1995 | Yamaji | |
| 5,404,044 A | 4/1995 | Booth et al. | |
| 5,406,124 A | 4/1995 | Morita et al. | |
| 5,410,180 A | 4/1995 | Fuji et al. | |
| 5,414,299 A | 5/1995 | Wang et al. | |
| 5,417,905 A | 5/1995 | Lemaire et al. | |
| 5,424,576 A | 6/1995 | Djennas et al. | |
| 5,428,248 A | 6/1995 | Cha | |
| 5,432,677 A | 7/1995 | Mowatt et al. | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,463,253 A | 10/1995 | Waki et al. | |
| 5,474,957 A | 12/1995 | Urushima | |
| 5,474,958 A | 12/1995 | Djennas et al. | |
| 5,484,274 A | 1/1996 | Neu | |
| 5,493,151 A | 2/1996 | Asada et al. | |
| 5,497,033 A | 3/1996 | Fillion et al. | |
| 5,508,556 A | 4/1996 | Lin | |
| 5,508,938 A | 4/1996 | Wheeler | |
| 5,517,056 A | 5/1996 | Bigler et al. | |
| 5,521,429 A | 5/1996 | Aono et al. | |
| 5,528,076 A | 6/1996 | Pavio | |
| 5,530,288 A | 6/1996 | Stone | |
| 5,531,020 A | 7/1996 | Durand et al. | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,546,654 A | 8/1996 | Wojnarowski et al. | |
| 5,574,309 A | 11/1996 | Papapietro et al. | |
| 5,576,517 A | 11/1996 | Wojnarowski et al. | |
| 5,578,525 A | 11/1996 | Mizukoshi | |
| 5,581,122 A | 12/1996 | Chao et al. | |
| 5,581,498 A | 12/1996 | Ludwig et al. | |
| 5,582,858 A | 12/1996 | Adamopoulos et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,265 A | 3/1997 | Kitano et al. | |
| 5,608,267 A | 3/1997 | Mahulikar et al. | |
| 5,616,422 A | 4/1997 | Ballard et al. | |
| 5,619,068 A | 4/1997 | Benzoni | |
| 5,625,222 A | 4/1997 | Yoneda et al. | |
| 5,633,528 A | 5/1997 | Abbott et al. | |
| 5,637,832 A | 6/1997 | Danner | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasarathi | |
| 5,661,088 A | 8/1997 | Tessier et al. | |
| 5,665,996 A | 9/1997 | Williams et al. | |
| 5,673,479 A | 10/1997 | Hawthorne | |
| 5,674,785 A | 10/1997 | Akram et al. | |
| 5,683,806 A | 11/1997 | Sakumoto et al. | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,719,749 A | 2/1998 | Stopperan | |
| 5,723,899 A | 3/1998 | Shin | |
| 5,724,233 A | 3/1998 | Honda et al. | |
| 5,726,493 A | 3/1998 | Yamashita et al. | |
| 5,736,432 A | 4/1998 | Mackessy | |
| 5,736,448 A | 4/1998 | Saia et al. | |

| | | | | | | |
|---|---|---|---|---|---|---|
| 5,739,581 A | 4/1998 | Chillara et al. | | 6,028,364 A | 2/2000 | Ogino et al. |
| 5,739,585 A | 4/1998 | Akram et al. | | 6,031,279 A | 2/2000 | Lenz |
| 5,739,588 A | 4/1998 | Ishida et al. | | RE36,613 E | 3/2000 | Ball |
| 5,742,479 A | 4/1998 | Asakura | | 6,034,423 A | 3/2000 | Mostafazadeh et al. |
| 5,745,984 A | 5/1998 | Cole, Jr. et al. | | 6,034,427 A | 3/2000 | Lan et al. |
| 5,753,532 A | 5/1998 | Sim | | 6,035,527 A | 3/2000 | Tamm |
| 5,753,977 A | 5/1998 | Kusaka et al. | | 6,040,622 A | 3/2000 | Wallace |
| 5,766,972 A | 6/1998 | Takahashi et al. | | 6,040,626 A | 3/2000 | Cheah et al. |
| 5,769,989 A | 6/1998 | Hoffmeyer et al. | | 6,043,430 A | 3/2000 | Chun |
| 5,770,888 A | 6/1998 | Song et al. | | 6,060,768 A | 5/2000 | Hayashida et al. |
| 5,774,340 A | 6/1998 | Chang et al. | | 6,060,769 A | 5/2000 | Wark |
| 5,776,798 A | 7/1998 | Quan et al. | | 6,060,778 A | 5/2000 | Jeong et al. |
| 5,783,861 A | 7/1998 | Son | | 6,069,407 A | 5/2000 | Hamzehdoost |
| 5,784,259 A | 7/1998 | Asakura | | 6,072,228 A | 6/2000 | Hinkle et al. |
| 5,786,238 A | 7/1998 | Pai et al. | | 6,072,243 A | 6/2000 | Nakanishi |
| 5,798,014 A | 8/1998 | Weber | | 6,075,284 A | 6/2000 | Choi et al. |
| 5,801,440 A | 9/1998 | Chu et al. | | 6,081,029 A | 6/2000 | Yamaguchi |
| 5,814,877 A | 9/1998 | Diffenderfer et al. | | 6,081,036 A | 6/2000 | Hirano et al. |
| 5,814,881 A | 9/1998 | Alagaratnam et al. | | 6,084,310 A | 7/2000 | Mizuno et al. |
| 5,814,883 A | 9/1998 | Sawai et al. | | 6,087,715 A | 7/2000 | Sawada et al. |
| 5,814,884 A | 9/1998 | Davis et al. | | 6,087,722 A | 7/2000 | Lee et al. |
| 5,817,540 A | 10/1998 | Wark | | 6,100,594 A | 8/2000 | Fukui et al. |
| 5,818,105 A | 10/1998 | Kouda | | 6,113,474 A | 9/2000 | Shih et al. |
| 5,821,457 A | 10/1998 | Mosley et al. | | 6,114,752 A | 9/2000 | Huang et al. |
| 5,821,615 A | 10/1998 | Lee | | 6,118,174 A | 9/2000 | Kim |
| 5,822,190 A | 10/1998 | Iwasaki | | 6,118,184 A | 9/2000 | Ishio et al. |
| 5,826,330 A | 10/1998 | Isoda et al. | | 6,119,338 A | 9/2000 | Wang et al. |
| 5,834,830 A | 11/1998 | Cho | | 6,122,171 A | 9/2000 | Akram et al. |
| 5,835,355 A | 11/1998 | Dordi | | RE36,907 E | 10/2000 | Templeton, Jr. et al. |
| 5,835,988 A | 11/1998 | Ishii | | 6,127,833 A | 10/2000 | Wu et al. |
| 5,841,193 A | 11/1998 | Eichelberger | | 6,130,115 A | 10/2000 | Okumura et al. |
| 5,844,306 A | 12/1998 | Fujita et al. | | 6,130,473 A | 10/2000 | Mostafazadeh et al. |
| 5,847,453 A | 12/1998 | Uematsu et al. | | 6,133,623 A | 10/2000 | Otsuki et al. |
| 5,856,911 A | 1/1999 | Riley | | 6,140,154 A | 10/2000 | Hinkle et al. |
| 5,859,471 A | 1/1999 | Kuraishi et al. | | 6,143,981 A | 11/2000 | Glenn |
| 5,859,475 A | 1/1999 | Freyman et al. | | 6,160,705 A | 12/2000 | Stearns et al. |
| 5,866,939 A | 2/1999 | Shin et al. | | 6,169,329 B1 | 1/2001 | Farnworth et al. |
| 5,871,782 A | 2/1999 | Choi | | 6,172,419 B1 | 1/2001 | Kinsman |
| 5,874,770 A | 2/1999 | Saia et al. | | 6,175,087 B1 | 1/2001 | Keesler et al. |
| 5,874,784 A | 2/1999 | Aoki et al. | | 6,177,718 B1 | 1/2001 | Kozono |
| 5,877,043 A | 3/1999 | Alcoe et al. | | 6,181,002 B1 | 1/2001 | Juso et al. |
| 5,883,425 A | 3/1999 | Kobayashi | | 6,181,569 B1 * | 1/2001 | Chakravorty ................. 361/761 |
| 5,886,397 A | 3/1999 | Ewer | | 6,184,463 B1 | 2/2001 | Panchou et al. |
| 5,886,398 A | 3/1999 | Low et al. | | 6,184,465 B1 | 2/2001 | Corisis |
| 5,894,108 A | 4/1999 | Mostafazadeh et al. | | 6,184,573 B1 | 2/2001 | Pu |
| 5,897,339 A | 4/1999 | Song et al. | | 6,194,250 B1 | 2/2001 | Melton et al. |
| 5,900,676 A | 5/1999 | Kweon et al. | | 6,194,777 B1 | 2/2001 | Abbott et al. |
| 5,903,049 A | 5/1999 | Mori | | 6,197,615 B1 | 3/2001 | Song et al. |
| 5,903,050 A | 5/1999 | Thurairajaratnam et al. | | 6,198,171 B1 | 3/2001 | Huang et al. |
| 5,903,052 A | 5/1999 | Chen et al. | | 6,201,186 B1 | 3/2001 | Daniels et al. |
| 5,907,477 A | 5/1999 | Tuttle et al. | | 6,201,292 B1 | 3/2001 | Yagi et al. |
| 5,909,053 A | 6/1999 | Fukase et al. | | 6,204,453 B1 | 3/2001 | Fallon et al. |
| 5,915,998 A | 6/1999 | Stidham et al. | | 6,204,554 B1 | 3/2001 | Ewer et al. |
| 5,917,242 A | 6/1999 | Ball | | 6,208,020 B1 | 3/2001 | Minamio et al. |
| 5,936,843 A | 8/1999 | Ohshima et al. | | 6,208,021 B1 | 3/2001 | Ohuchi et al. |
| 5,937,324 A | 8/1999 | Abercrombie et al. | | 6,208,023 B1 | 3/2001 | Nakayama et al. |
| 5,939,779 A | 8/1999 | Kim | | 6,211,462 B1 | 4/2001 | Carter, Jr. et al. |
| 5,942,794 A | 8/1999 | Okumura et al. | | 6,214,525 B1 | 4/2001 | Boyko et al. |
| 5,951,305 A | 9/1999 | Haba | | 6,214,641 B1 | 4/2001 | Akram |
| 5,952,611 A | 9/1999 | Eng et al. | | 6,218,731 B1 | 4/2001 | Huang et al. |
| 5,959,356 A | 9/1999 | Oh | | 6,222,258 B1 | 4/2001 | Asano et al. |
| 5,969,426 A | 10/1999 | Baba et al. | | 6,222,259 B1 | 4/2001 | Park et al. |
| 5,973,388 A | 10/1999 | Chew et al. | | 6,225,146 B1 | 5/2001 | Yamaguchi et al. |
| 5,976,912 A | 11/1999 | Fukutomi et al. | | 6,229,200 B1 | 5/2001 | Mclellan et al. |
| 5,977,613 A | 11/1999 | Takata et al. | | 6,229,205 B1 | 5/2001 | Jeong et al. |
| 5,977,615 A | 11/1999 | Yamaguchi et al. | | 6,235,554 B1 | 5/2001 | Akram et al. |
| 5,977,630 A | 11/1999 | Woodworth et al. | | 6,239,367 B1 | 5/2001 | Hsuan et al. |
| 5,981,314 A | 11/1999 | Glenn et al. | | 6,239,384 B1 | 5/2001 | Smith et al. |
| 5,982,632 A | 11/1999 | Mosley et al. | | 6,239,485 B1 | 5/2001 | Peters et al. |
| 5,986,333 A | 11/1999 | Nakamura | | 6,242,281 B1 | 6/2001 | Mclellan et al. |
| 5,986,885 A | 11/1999 | Wyland | | D445,096 S | 7/2001 | Wallace |
| 6,001,671 A | 12/1999 | Fjelstad | | 6,256,200 B1 | 7/2001 | Lam et al. |
| 6,004,619 A | 12/1999 | Dippon et al. | | 6,258,192 B1 | 7/2001 | Natarajan |
| 6,013,947 A | 1/2000 | Lim | | 6,258,629 B1 | 7/2001 | Niones et al. |
| 6,013,948 A | 1/2000 | Akram et al. | | 6,261,918 B1 | 7/2001 | So |
| 6,018,189 A | 1/2000 | Mizuno | | D446,525 S | 8/2001 | Okamoto et al. |
| 6,020,625 A | 2/2000 | Qin et al. | | 6,274,821 B1 | 8/2001 | Echigo et al. |
| 6,021,564 A | 2/2000 | Hanson | | 6,280,641 B1 | 8/2001 | Gaku et al. |
| 6,025,640 A | 2/2000 | Yagi et al. | | 6,281,566 B1 | 8/2001 | Magni |

| Patent | Date | Inventors |
|---|---|---|
| 6,281,568 B1 | 8/2001 | Glenn et al. |
| 6,282,095 B1 | 8/2001 | Houghton et al. |
| 6,285,075 B1 | 9/2001 | Combs et al. |
| 6,288,905 B1 * | 9/2001 | Chung .................... 361/771 |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,285 B1 | 11/2001 | Jiang et al. |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,351,031 B1 | 2/2002 | Iijima et al. |
| 6,353,999 B1 | 3/2002 | Cheng |
| 6,355,502 B1 | 3/2002 | Kang et al. |
| 6,365,974 B1 | 4/2002 | Abbott et al. |
| 6,365,975 B1 | 4/2002 | DiStefano et al. |
| 6,369,447 B2 | 4/2002 | Mori |
| 6,369,454 B1 | 4/2002 | Chung |
| 6,373,127 B1 | 4/2002 | Baudouin et al. |
| 6,376,906 B1 | 4/2002 | Asai et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,392,160 B1 | 5/2002 | Andry et al. |
| 6,395,578 B1 | 5/2002 | Shin et al. |
| 6,396,148 B1 | 5/2002 | Eichelberger et al. |
| 6,396,153 B2 | 5/2002 | Fillion et al. |
| 6,400,004 B1 | 6/2002 | Fan et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,510 B1 | 9/2002 | Neftin et al. |
| 6,448,633 B1 | 9/2002 | Yee et al. |
| 6,451,509 B2 | 9/2002 | Keesler et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Hung et al. |
| 6,476,474 B1 | 11/2002 | Hung |
| 6,479,762 B2 | 11/2002 | Kusaka |
| 6,482,680 B1 | 11/2002 | Khor et al. |
| 6,497,943 B1 | 12/2002 | Jimarez et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,517,995 B1 | 2/2003 | Jacobson et al. |
| 6,521,530 B2 | 2/2003 | Peters et al. |
| 6,524,885 B2 | 2/2003 | Pierce |
| 6,534,391 B1 | 3/2003 | Huemoeller et al. |
| 6,534,849 B1 | 3/2003 | Gang |
| 6,544,638 B2 | 4/2003 | Fischer et al. |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |
| 6,583,503 B2 | 6/2003 | Akram et al. |
| 6,586,682 B2 | 7/2003 | Strandberg |
| 6,593,645 B2 | 7/2003 | Shih et al. |
| 6,603,196 B2 | 8/2003 | Lee et al. |
| 6,608,757 B1 | 8/2003 | Bhatt et al. |
| 6,624,005 B1 | 9/2003 | DiCaprio et al. |
| 6,660,559 B1 | 12/2003 | Huemoeller et al. |
| 6,667,546 B2 | 12/2003 | Huang et al. |
| 6,671,398 B2 | 12/2003 | Reinhorn et al. |
| 6,686,659 B2 * | 2/2004 | Seshan .................... 257/737 |
| 6,701,614 B2 * | 3/2004 | Ding et al. .................... 29/848 |
| 6,715,204 B1 | 4/2004 | Tsukada et al. |
| 6,727,576 B2 | 4/2004 | Hedler et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,830,958 B2 | 12/2004 | Makimoto |
| 6,831,371 B1 | 12/2004 | Huemoeller et al. |
| 6,836,019 B2 * | 12/2004 | Yang et al. .................... 257/774 |
| 6,838,776 B2 | 1/2005 | Leal et al. |
| 6,845,554 B2 | 1/2005 | Frankowsky et al. |
| 6,888,240 B2 | 5/2005 | Towle et al. |
| 6,905,914 B1 | 6/2005 | Huemoeller et al. |
| 6,919,514 B2 | 7/2005 | Konrad et al. |
| 6,921,968 B2 | 7/2005 | Chung |
| 6,921,975 B2 | 7/2005 | Leal et al. |
| 6,930,256 B1 | 8/2005 | Huemoeller et al. |
| 6,931,726 B2 | 8/2005 | Boyko et al. |
| 6,936,525 B2 | 8/2005 | Nishiyama et al. |
| 6,953,995 B2 | 10/2005 | Farnworth et al. |
| 7,015,075 B2 | 3/2006 | Fay et al. |
| 7,030,469 B2 | 4/2006 | Mahadevan et al. |
| 7,041,534 B2 | 5/2006 | Chao et al. |
| 7,081,661 B2 | 7/2006 | Takehara et al. |
| 7,125,744 B2 | 10/2006 | Takehara et al. |
| 7,129,158 B2 | 10/2006 | Nakai |
| 7,185,426 B1 | 3/2007 | Hiner et al. |
| 7,190,062 B1 | 3/2007 | Sheridan et al. |
| 7,192,807 B1 | 3/2007 | Huemoeller et al. |
| 7,198,980 B2 | 4/2007 | Jiang et al. |
| 7,202,107 B2 | 4/2007 | Fuergut et al. |
| 7,215,019 B1 * | 5/2007 | Lin et al. .................... 257/691 |
| 7,242,081 B1 | 7/2007 | Lee |
| 7,247,523 B1 | 7/2007 | Huemoeller et al. |
| 7,272,444 B2 | 9/2007 | Peterson et al. |
| 7,282,394 B2 | 10/2007 | Cho et al. |
| 7,285,855 B2 | 10/2007 | Foong |
| 7,345,361 B2 | 3/2008 | Mallik et al. |
| 7,361,533 B1 | 4/2008 | Huemoeller et al. |
| 7,372,151 B1 | 5/2008 | Fan et al. |
| 7,396,700 B2 * | 7/2008 | Hsu .................... 438/107 |
| 7,420,272 B1 | 9/2008 | Huemoeller et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,572,681 B1 | 8/2009 | Huemoeller et al. |
| 7,633,765 B1 | 12/2009 | Scanlan et al. |
| 7,671,457 B1 | 3/2010 | Hiner et al. |
| 7,692,286 B1 | 4/2010 | Huemoeller et al. |
| 7,714,431 B1 | 5/2010 | Huemoeller et al. |
| 7,714,443 B2 * | 5/2010 | Chen et al. .................... 257/758 |
| 7,723,210 B2 | 5/2010 | Berry et al. |
| 7,777,351 B1 | 8/2010 | Berry et al. |
| 8,026,590 B2 * | 9/2011 | Kang et al. .................... 257/690 |
| 8,035,224 B2 * | 10/2011 | Poeppel et al. .................... 257/724 |
| 2001/0008305 A1 | 7/2001 | McLellan et al. |
| 2001/0011654 A1 | 8/2001 | Schmidt et al. |
| 2001/0012704 A1 | 8/2001 | Eldridge |
| 2001/0014538 A1 | 8/2001 | Kwan et al. |
| 2002/0017712 A1 | 2/2002 | Bessho et al. |
| 2002/0024122 A1 | 2/2002 | Jung et al. |
| 2002/0027297 A1 | 3/2002 | Ikenaga et al. |
| 2002/0061642 A1 | 5/2002 | Haji et al. |

| | | |
|---|---|---|
| 2002/0066952 A1 | 6/2002 | Taniguchi et al. |
| 2002/0140061 A1 | 10/2002 | Lee |
| 2002/0140068 A1 | 10/2002 | Lee et al. |
| 2002/0163015 A1 | 11/2002 | Lee et al. |
| 2002/0195697 A1 | 12/2002 | Mess et al. |
| 2003/0013232 A1 | 1/2003 | Towle et al. |
| 2003/0025199 A1 | 2/2003 | Wu et al. |
| 2003/0030131 A1 | 2/2003 | Lee et al. |
| 2003/0064548 A1 | 4/2003 | Isaak |
| 2003/0073265 A1 | 4/2003 | Hu et al. |
| 2003/0128096 A1 | 7/2003 | Mazzochette |
| 2003/0134455 A1 | 7/2003 | Cheng et al. |
| 2003/0141582 A1 | 7/2003 | Yang et al. |
| 2003/0197284 A1 | 10/2003 | Khiang et al. |
| 2004/0004293 A1 | 1/2004 | Murayama |
| 2004/0026781 A1 | 2/2004 | Nakai |
| 2004/0046244 A1 | 3/2004 | Nakamura et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0113260 A1 | 6/2004 | Sunohara et al. |
| 2004/0145044 A1 | 7/2004 | Sugaya et al. |
| 2004/0159462 A1 | 8/2004 | Chung |
| 2005/0139985 A1 | 6/2005 | Takahashi |
| 2005/0212129 A1* | 9/2005 | Huang et al. ............... 257/737 |
| 2005/0242425 A1 | 11/2005 | Leal et al. |
| 2005/0282314 A1 | 12/2005 | Lo et al. |
| 2006/0113680 A1* | 6/2006 | DiStefano ................ 257/779 |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0002460 A1* | 1/2008 | Tuckerman et al. ......... 365/158 |
| 2008/0054460 A1* | 3/2008 | Hung ........................ 257/737 |
| 2008/0230887 A1 | 9/2008 | Sun et al. |
| 2010/0193947 A1* | 8/2010 | Pendse ...................... 257/737 |
| 2011/0068461 A1* | 3/2011 | England ..................... 257/700 |
| 2011/0108970 A1* | 5/2011 | Lee et al. .................... 257/676 |

FOREIGN PATENT DOCUMENTS

| | | |
|---|---|---|
| EP | 0 393 997 | 10/1990 |
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-109975 | 4/1993 |
| JP | 05-129473 | 5/1993 |
| JP | 05-136323 | 6/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-017175 | 1/1995 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-190615 | 7/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 10-334205 | 12/1998 |
| JP | 2000-150765 | 5/2000 |
| JP | 2000-556398 | 10/2000 |
| JP | 2001-060648 | 3/2001 |
| JP | 2002-043497 | 2/2002 |
| JP | 2008-285593 | 11/2008 |
| KR | 1994-0001979 | 1/1994 |
| KR | 10-0220154 | 6/1999 |
| KR | 2002-0049944 | 6/2002 |
| WO | WO 99/56316 | 11/1999 |
| WO | WO 99/67821 | 12/1999 |

OTHER PUBLICATIONS

Kim et al., "Application of Through Mold Via (TMV) as PoP base package", 58$^{th}$ ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Hiner et al., "Printed Wiring Motherboard Having Bonded Interconnect Redistribution Mesa", U.S. Appl. No. 10/992,371, filed Nov. 18, 2004.

Berry et al., "Direct-Write Wafer Level Chip Scale Package", U.S. Appl. No. 11/289,826, filed Nov. 29, 2005.

Lee et al., "Substrate for Semiconductor Device and Manufacturing Method Thereof", U.S. Appl. No. 11/440,548, filed May 24, 2006.

Huemoeller et al., "Build Up Motherboard Fabrication Method and Structure", U.S. Appl. No. 11/824,395, filed Jun. 29, 2007.

Longo et al., "Stacked Redistribution Layer (RDL) Die Assembly Package", U.S. Appl. No. 12/387,672, filed May 5, 2009.

Huemoeller et al., "Buildup Dielectric Layer Having Metallization Pattern Semiconductor Package Fabrication Method", U.S. Appl. No. 12/387,691, filed May 5, 2009.

Miller Jr. et al., "Thermal Via Heat Spreader Package and Method", U.S. Appl. No. 12/421,118, filed Apr. 9, 2009.

Huemoeller et al., "Embedded Electronic Component Package Fabrication Method", U.S. Appl. No. 12/459,532, filed Jul. 2, 2009.

Scanlan et al., "Fan Out Build Up Substrate Stackable Package and Method", U.S. Appl. No. 12/573,466, filed Oct. 5, 2009.

Scanlan et al., "Semiconductor Package Including a Top-Surface Metal Layer for Implementing Circuit Features", U.S. Appl. No. 12/589,839, filed Oct. 28, 2009.

Dunlap et al., "Thin Stackable Package and Method", U.S. Appl. No. 12/630,586, filed Dec. 3, 2009.

Dunlap et al., "Mold Compound Lamination Electronic Component Package Formation Method", U.S. Appl. No. 12/632,170, filed Dec. 7, 2009.

* cited by examiner

SEMICONDUCTOR DEVICE AND FABRICATING METHOD THEREOF

TECHNICAL FIELD

The present application relates to a semiconductor device and a fabricating method thereof.

BACKGROUND

In general, a chip size package refers to a package having the same size as or slightly bigger than a chip. The chip size package has a compact, lightweight and thin profile. In the related art, a package in which an area occupied by chips exceeds 80% of a total package area has been defined as the chip size package. However, there has no standardized definition been hitherto.

To minimize the fabrication cost of the chip size package, it is desirable to avoid the use of expensive material and to maximize the yield.

BRIEF DESCRIPTION OF THE DRAWINGS

Common reference numerals are used throughout the drawings and the detailed description to indicate the same elements.

DETAILED DESCRIPTION

Figure 1:
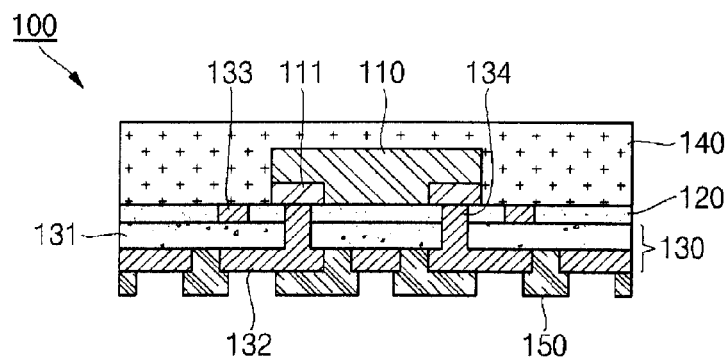
FIG. 1 is a cross-sectional view of a semiconductor device according to one embodiment.

Referring to FIG. 1, a cross-sectional view of a semiconductor device according to one embodiment is illustrated.

As illustrated in FIG. 1, the semiconductor device 100 includes a semiconductor die 110, an adhesive member 120, a lamination member 130, an encapsulant 140 and a solder resist 150.

The semiconductor die 110 includes a plurality of bond pads 111 on its bottom, e.g., first, surface. In another embodiment, bond pads 111 are derived from a redistribution layer formed on the bottom surface of the semiconductor die 110.

The top, e.g., first, surface of the adhesive member 120 is attached to the bottom surface of the semiconductor die 110. The adhesive member 120 is wider than the semiconductor die 110. Here, the adhesive member 120 may be a common die attach film. In addition, the adhesive member 120 may be at least one selected from an adhesive tape, an adhesive agent, and equivalents thereof.

The top, e.g., first, surface of the lamination member 130 is attached to a bottom, e.g., second, surface of the adhesive member 120. The lamination member 130 includes an insulation layer 131, a plurality of conductive patterns 132 formed on a bottom, e.g., first, surface of the insulation layer 131, and a plurality of fiducial patterns 133 formed on a top, e.g., second, surface of the insulation layer 131. Here, a width of the insulation layer 131 may be equal to that of the adhesive member 120. In addition, conductive vias 134 are formed to pass through the adhesive member 120 and the lamination member 130. The conductive vias 134 electrically connect the bond pads 111 to the conductive patterns 132, respectively. In addition, the plurality of the fiducial patterns 133 pass through the adhesive member 120. Further, even when the fiducial patterns 133 do not pass through the adhesive member 120, they are formed to be visible from above the adhesive member 120. To this end, the adhesive member 120 may be a semi-transparent or transparent material. The fiducial patterns 133 are formed to be spaced apart from the semiconductor die 110 and used as alignment marks when the semiconductor die 110 is attached onto the adhesive member 120. Meanwhile, the lamination member 130 may be a copper clad lamination, but aspects of the present embodiment are not limited thereto.

The encapsulant 140 encapsulates the semiconductor die 110 disposed on the adhesive member 120. That is to say, the encapsulant 140 encapsulates the top, e.g., second, and side surfaces of the semiconductor die 110. In addition, the encapsulant 140 encapsulates the top surface of the adhesive member 120 corresponding to an outer periphery of the semiconductor die 110. The encapsulant 140 may be an epoxy molding compound used in the general transfer molding method or a UV curable glob top used in the general dispensing method, but aspects of the present embodiment are not limited thereto.

The solder resist 150 is formed on a bottom, e.g., second, surface of the lamination member 130. Of course, the land region of the conductive patterns 132 to which solder balls (not shown) are to be connected in a later operation is exposed through the solder resist 150. The land region will further be described below.

Referring to FIGS. 2A through 2G, cross-sectional views illustrating a fabricating method of the semiconductor device 100 illustrated in FIG. 1 are illustrated.

As illustrated in FIGS. 2A through 2G, the fabricating method of the semiconductor device 100 according to one embodiment includes operations of laminating, encapsulating, forming via holes, forming conductive vias, forming solder resist, and separating.

Figure 2A:
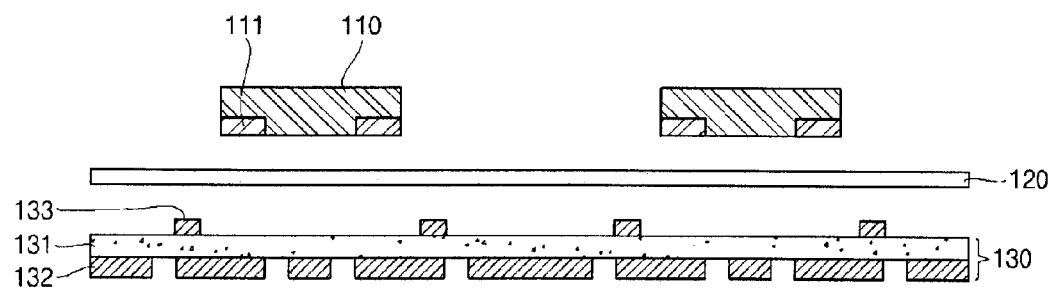
FIGS. 2A, 2B, 2C, 2D, 2E, 2F, 2G are cross-sectional views illustrating a fabricating method of the semiconductor device illustrated in FIG. 1.

As illustrated in FIG. 2A, in the operation of laminating, the plurality of semiconductor dies 110 having the bond pads 111, the adhesive member 120 and the lamination member 130 having the plurality of conductive patterns 132 are laminated together. Here, the lamination member 130 includes the plurality of conductive patterns 132 and the plurality of fiducial patterns 133 formed on the bottom and top surfaces of the insulation layer 131, respectively. The lamination member 130 may be a copper clad lamination, but aspects of the present embodiment are not limited thereto.

In addition, the semiconductor dies 110 are mounted on the adhesive member 120 such that the bond pads 111 face downward. Further, the semiconductor dies 110 are positioned accurately without errors on predefined regions based on positions of the fiducial patterns 133. Of course, the fiducial patterns 133 are formed to be visible from above the adhesive member 120 irrespective of whether or not they pass through the adhesive member 120.

Figure 2B:
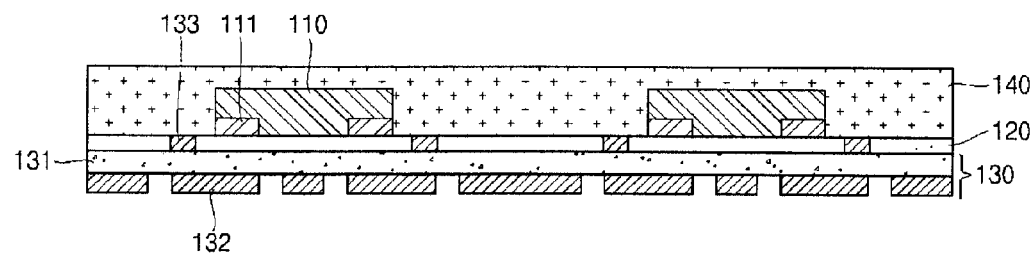

As illustrated in FIG. 2B, in the operation of encapsulating, the semiconductor dies 110 mounted on the adhesive member 120 are encapsulated by the encapsulant 140. The encapsulant 140 may be an epoxy molding compound used in the general transfer molding method or a UV curable glob top used in the general dispensing method, but aspects of the present embodiment are not limited thereto. In addition, as illustrated in FIG. 2B, the plurality of semiconductor dies 110 are positioned inside the encapsulant 140 using a gang molding method. Alternatively, each of the plurality of semiconductor dies 110 may also be positioned inside an independently corresponding encapsulant 140 by an independent molding method (not shown).

Figure 2C:
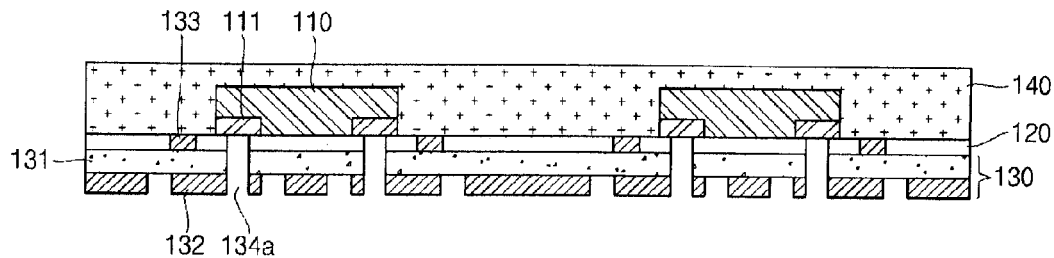

As illustrated in FIG. 2C, in the via hole forming operation, via holes 134a passing through the adhesive member 120 and the lamination member 130 are formed. That is to say, in the via hole forming operation, the via holes 134a that pass through the conductive patterns 132 and the insulation layer 131 of the lamination member 130 and then pass through the adhesive member 120 are formed. The via holes 134a allow the bond pads 111 of the semiconductor dies 110 to be exposed downward. The via holes 134a may be formed by common laser beams or etching solutions, but aspects of the present embodiment are not limited thereto.

Figure 2D:
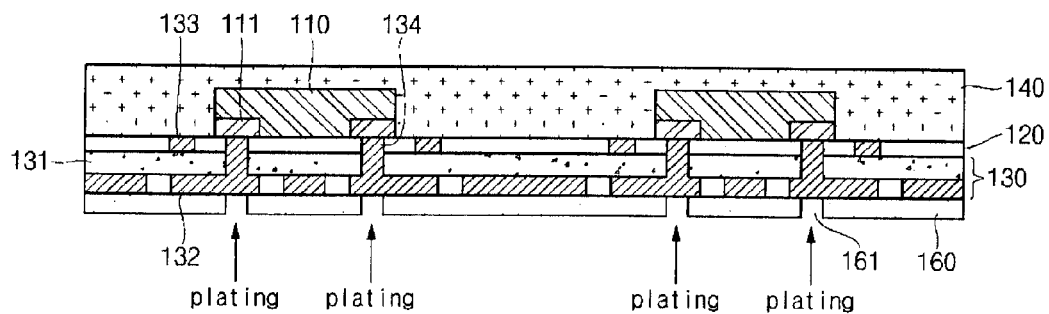
Figure 2E:
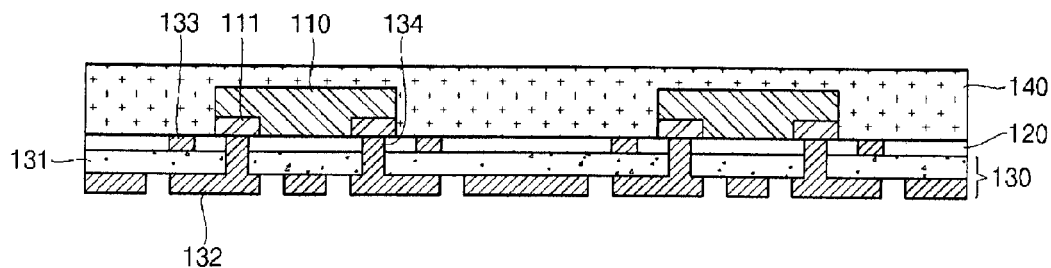

As illustrated in FIGS. 2D and 2E, in the conductive via forming operation, a conductor is plated in the via holes 134a to form conductive vias 134. To this end, as illustrated in FIG. 2D, photoresist 160 is first laminated and openings 161 are formed at portions corresponding to the via holes 134a using conventional photolithography. Next, the conductor is plated into the via holes 134a through the openings 161 by an electroless plating and/or an electroplating method, thereby forming conductive vias 134 connecting the bond pads 111 and the conductive patterns 132 to each other. Next, as illustrated in FIG. 2E, the photoresist 160 is removed to allow the conductive patterns 132 to be exposed downward from the lamination member 130.

Figure 2F:
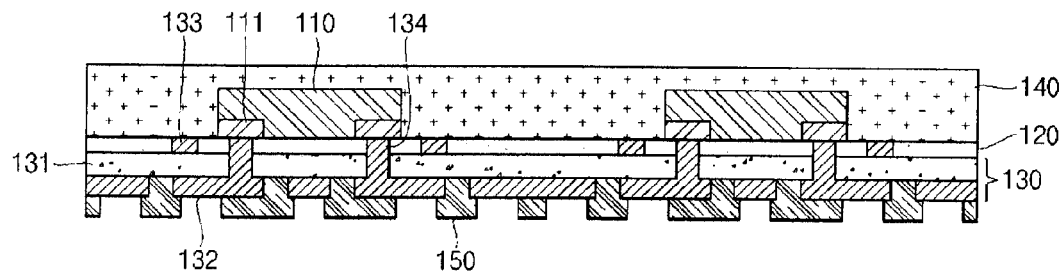

As illustrated in FIG. 2F, in the operation of forming the solder resist 150, the solder resist 150 is laminated on the bottom surface of the lamination member 130 to allow the conductive patterns 132 to be covered by the solder resist 150. Here, a predetermined portion of the solder resist 150 is removed by drilling or etching in a subsequent operation to selectively expose the conductive patterns 132. The exposed (removed) portion of the solder resist 150 may be particularly referred to as a land region.

Figure 2G:
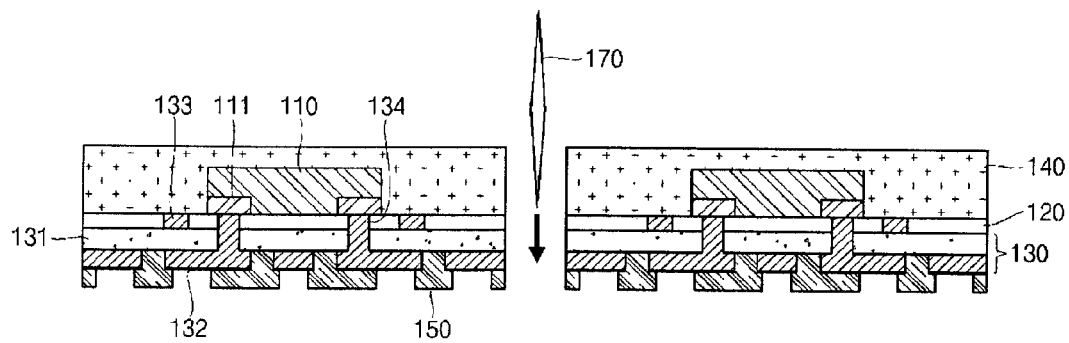

As illustrated in FIG. 2G, in the operation of separating, the encapsulant 140, the adhesive member 120, the lamination member 130 and the solder resist 150 are separated, sometimes called singulated, by sawing using a sawing tool 170, thereby forming the single semiconductor device 100. Of course, the sawing may be performed in the reverse order to the above.

The via hole forming operation may not be performed. That is to say, in the laminating operation, the lamination member 130 having via holes 134a previously formed therein may be provided. In this case, the conductive via forming operation may be immediately performed without performing the via hole forming operation. Therefore, the use of the lamination member 130 having via holes 134a previously formed therein can noticeably reduce the number of processing operations in the manufacture of the semiconductor device 100.

Therefore, according to the semiconductor device 100 of the present embodiment and the fabricating method thereof, since the lamination member 130 has the via holes 134a previously formed therein, the number of processing operations of photolithography, dielectric layer formation, and plating can be reduced, thereby improving the yield of the semiconductor device 100.

In addition, according to the semiconductor device 100 of the present embodiment and the fabricating method thereof, the fiducial patterns 133 are formed in the semiconductor device 100, mounting errors of the semiconductor dies 110, which may be produced in the attaching operation of the semiconductor dies 110, may be reduced.

Further, since costly thermosensitive sheets are not used, the manufacturing cost of the semiconductor device 100 can further be reduced.

Figure 3:
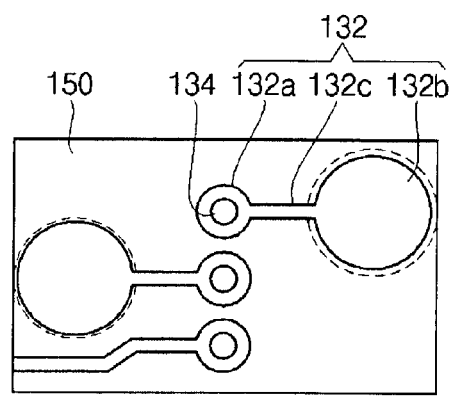
FIG. 3 is a partially plan view of a conductive pattern illustrated in FIG. 1.

Referring to FIG. 3, a partially plan view of a conductive pattern illustrated in FIG. 1 is illustrated.

As illustrated in FIG. 3, conductive patterns 132 may include a via region 132a having conductive vias 134 formed therein, a land region 132b that is relatively wide so that solder balls are mounted thereon, and a connecting region 132c connecting the via region 132a and the land region 132b to each other. The via region 132a and the connecting region 132c are covered by the solder resist 150 while the land region 132b is exposed outside through the solder resist 150. In addition, via holes are formed in the via region 132a during the fabrication process, and the conductive vias 134 are formed in the via holes.

The via region 132a makes drill positioning for via hole formation easily controllable. Accordingly, via hole diameters can also be controlled to be uniform. In addition to the drill positioning, the via region 132a can considerably reduce a deviation between each of the via hole diameters.

Further, in a case where the via holes have been formed at an initial operation of forming the lamination member, a lead time of the overall semiconductor devices can considerably be reduced, which is because the plating operation can be performed immediately after the operations of attaching the semiconductor dies and encapsulating. In addition, since the conductive patterns 132 are formed on the bottom surface of the lamination member, fiducial marks can be set during laser drilling. Accordingly, drill positions can be easily determined during laser drilling.

Figure 4A:
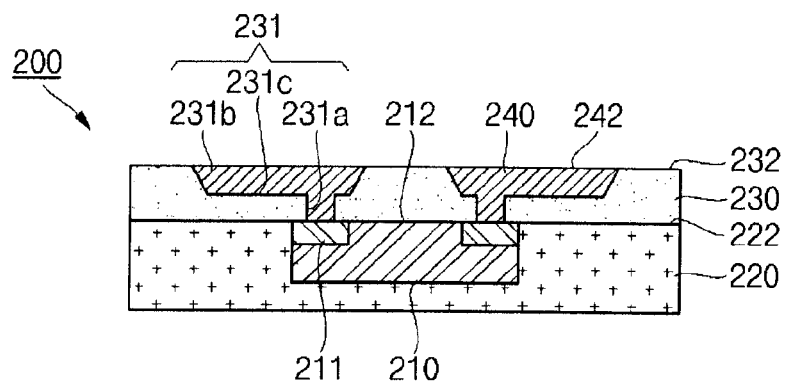
FIG. 4A is a cross-sectional view of a semiconductor device according to another embodiment.
Figure 4B:
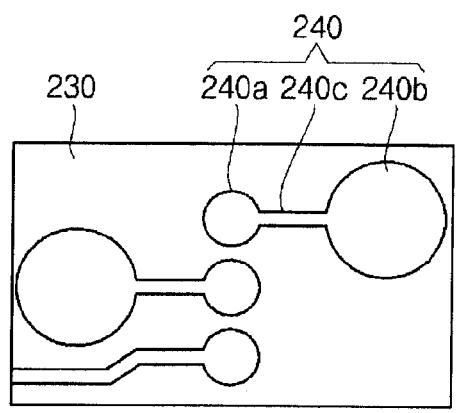
FIG. 4B is a partially plan view of the semiconductor device illustrated in FIG. 4A.

Referring to FIG. 4A, a cross-sectional view of a semiconductor device 200 according to another embodiment is illustrated. Referring to FIG. 4B, a partially plan view of the semiconductor device illustrated in FIG. 4A is illustrated.

As illustrated in FIG. 4A, the semiconductor device 200 according to another embodiment includes a semiconductor die 210, encapsulant 220, a dielectric 230 and conductive patterns 240.

The semiconductor die 210 includes a plurality of bond pads 211 on its top, e.g., first, surface 212. Of course, bond pads 211 may be derived from a redistribution layer formed on top surface 212 of the semiconductor die 210.

The encapsulant 220 encapsulates the semiconductor die 210. The encapsulant 220 encapsulates only bottom, e.g., second, and lateral surfaces of the semiconductor die 210. That is to say, a top, e.g., first, surface 222 of the encapsulant 220 and a top surface 212 of the semiconductor die 210 are coplanar and the top surface 212 is exposed from the encapsulant 220.

The dielectric 230 is formed on and encloses the top surfaces 212 and 222 of the semiconductor die 210 and the encapsulant 220. The dielectric 230 may be at least one selected from the group consisting of phenolic resin, polyimide (PI), benzocyclobutene (BCB), polybenzoxazole (PBO), epoxy, and equivalents thereof, but aspects of the present embodiment are not limited thereto in view of the material of the dielectric 230. Here, openings 231 are formed in the dielectric 230. The openings 231 include first openings 231a, second openings 231b and a bottom, e.g., first, surface 231c. The first openings 231a are formed at positions corresponding to the bond pads 211. The second openings 231b are connected to the first openings 231a and are formed to have diameters larger than those of the first openings 231a. In addition, the second openings 231b are formed to slant, i.e., are non perpendicular to a top surface 232 of the dielectric 230. Further, the bottom surface 231c formed between the first openings 231a and the second openings 231b is planar.

The conductive patterns 240 are plated on the bond pads 211 and are mounted in the openings 231 of the dielectric 230 at the same time. That is to say, the conductive patterns 240 are formed in and fill the first openings 231a, the second openings 231b and on the bottom surface 231c. Further, a top, e.g., first, surface 242 of the conductive patterns 240 and the top surface 232 of the dielectric 230 are coplanar.

As illustrated in FIG. 4B, the conductive patterns 240 may include a via region 240a connected to bond pads 211, a land region 240b on which solder balls are to be mounted in a later operation, and a connecting region 240c connecting the via region 240a and the land region 240b. Since the solder balls or the like to be electrically connected to external devices are provided at the land region 240b, a diameter of the land region 240b is larger than that of the via region 240a.

Referring to FIGS. 5A through 5F, cross-sectional views illustrating a fabricating method of the semiconductor device illustrated in FIG. 4A are illustrated.

Referring to FIGS. 5A through 5F, the fabricating method of the semiconductor device 200 includes operations of encapsulating, removing an adhesive tape, forming a dielectric, plating a conductor, grinding, and separating.

Figure 5A:
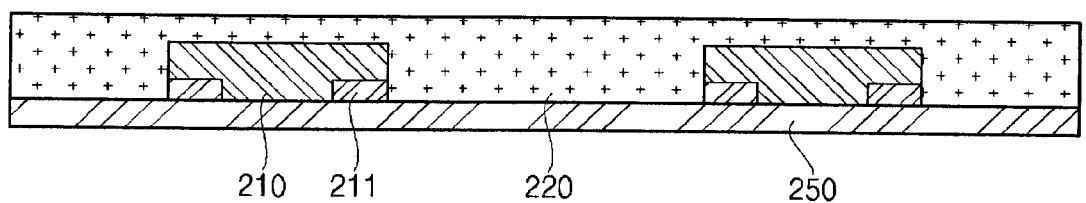
FIGS. 5A, 5B, 5C, 5D, 5E, 5F are cross-sectional views illustrating a fabricating method of the semiconductor device illustrated in FIG. 4A.

As illustrated in FIG. 5A, in the operation of encapsulating, the plurality of semiconductor dies 210 having the bond pads 211 are attached to the adhesive tape 250, and the semiconductor dies 210 are encapsulated by an encapsulant 220. Here, the bond pads 211 of the semiconductor dies 210 are allowed to face the adhesive tape 250. Here, the encapsulant 220 may be an epoxy molding compound used in the general transfer molding method or a UV curable glob top used in the general dispensing method, but aspects of the present embodiment are not limited thereto. In addition, the adhesive tape 250 may be at least one selected from a UV sensitive tape, a general insulating tape, and equivalents thereof, but aspects of the present embodiment are not limited thereto in view of the material thereof.

Figure 5B:
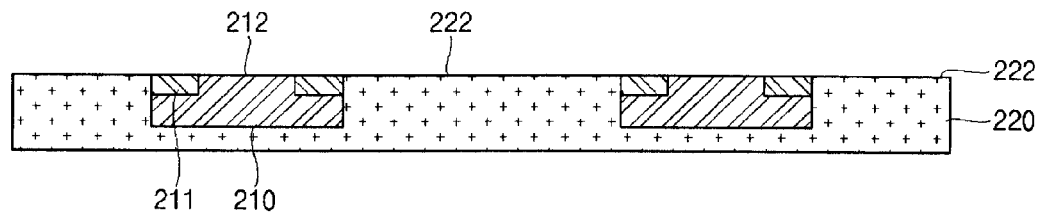

As illustrated in FIG. 5B, in the operation of removing an adhesive tape, the adhesive tape 250 is removed from the semiconductor dies 210 and the encapsulant 220. In such a manner, the bond pads 211 of the semiconductor dies 210 are exposed outside. Further, a top surface 212 of the semiconductor dies 210 and a top surface 222 of the encapsulant 220 are coplanar.

Figure 5C:
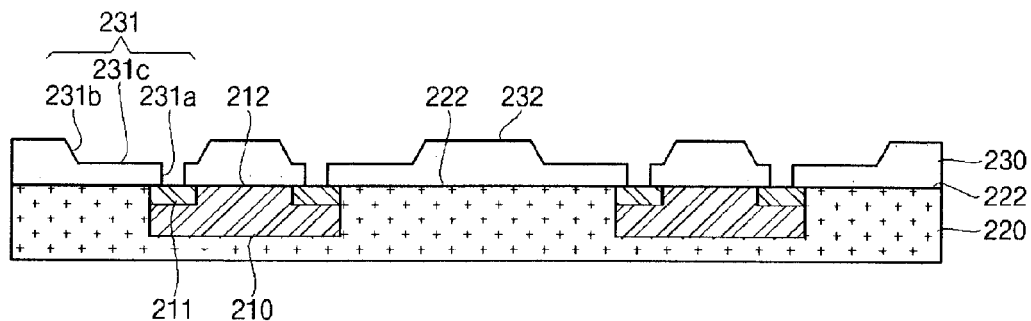

As illustrated in FIG. 5C, in the operation of forming a dielectric, a dielectric 230 having a predetermined pattern is formed on the semiconductor dies 210 and the encapsulant 220. Here, openings 231 through which the bond pads 211 are exposed upward are formed in the dielectric 230. The openings 231 include first openings 231a formed at positions at which they overlap with the bond pads 211, second openings 231b led from the first openings 231a and formed to have diameters larger than those of the first openings 231a and to be slanted, and a bottom surface 231c formed between the first openings 231a and the second openings 231b to be planar. The dielectric 230 may be at least one selected from the group consisting of phenolic resin, polyimide (PI), benzocyclobutene (BCB), polybenzoxazole (PBO), epoxy, and equivalents thereof, but aspects of the present embodiment are not limited thereto in view of the material of the dielectric 230.

Figure 5D:
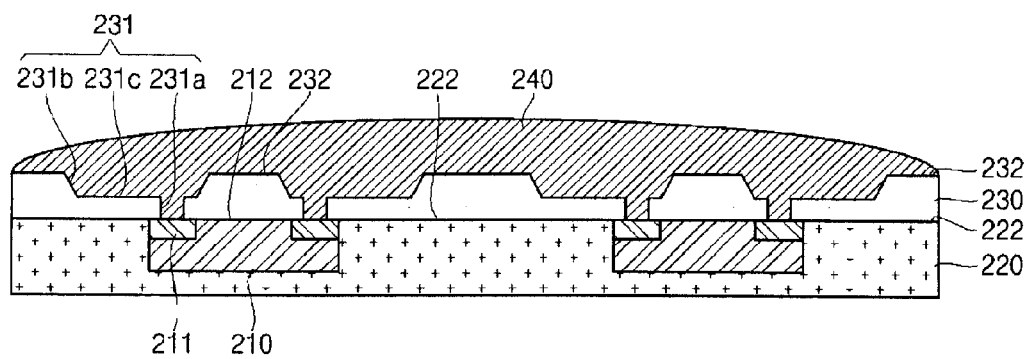

As illustrated in FIG. 5D, in the operation of plating a conductor, a conductor 240 having a predetermined thickness is plated on the semiconductor dies 210 and the dielectric 230. In such a manner, the conductor 240 is electrically connected to the bond pads 211 of the semiconductor dies 210. Here, the conductor 240 is formed thickly enough to cover the dielectric 230.

Figure 5E:
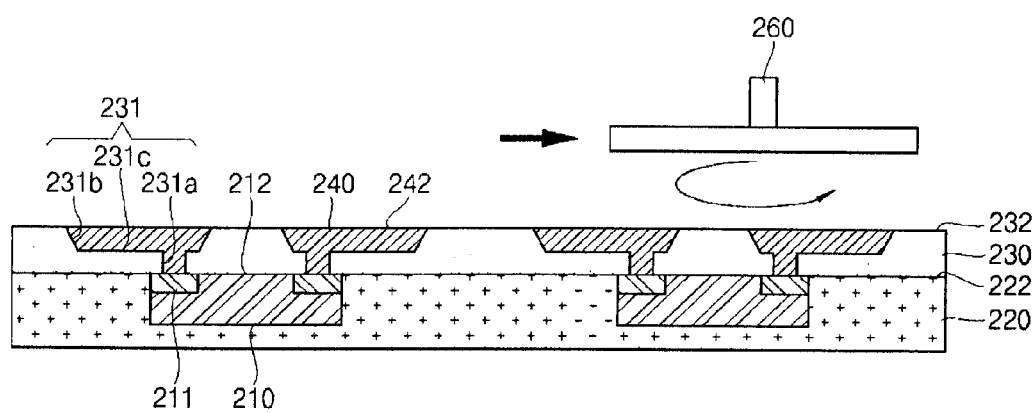

As illustrated in FIG. 5E, in the operation of grinding, the conductor 240 formed on the dielectric 230 is subjected to grinding using a grinding tool 260, thereby removing unnecessary portions of the conductor 240. Finally, the conductive patterns 240 connected to the bond pads 211 and positioned in the openings 231 of the dielectric 230 are formed in the operation of grinding. Here, the second openings 231b of the openings 231 are formed to slant, thereby accurately controlling widths of the conductive patterns 240. That is to say, grinding amounts of the conductor 240 and the dielectric 230 can be controlled by adjusting a grinding depth of the grinding tool 260. Accordingly, the widths of the conductive patterns 240 exposed through the second openings 231b can be controlled. For example, when the grinding depth by the grinding tool 260 is relatively small, the widths of the conductive patterns 240 become increased. On the other hand, when the grinding depth by the grinding tool 260 is relatively large, the widths of the conductive patterns 240 are reduced.

Figure 5F:
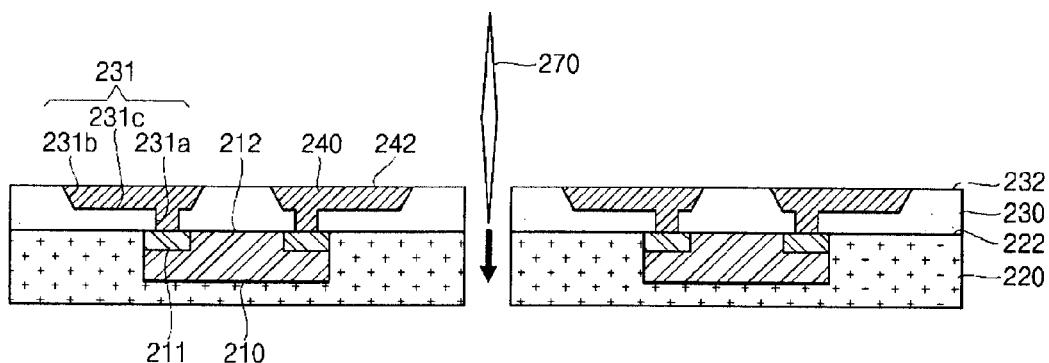

As illustrated in FIG. 5F, in the operation of separating, the dielectric 230 and the encapsulant 220 are separated by sawing using a sawing tool 270, thereby forming the single semiconductor devices 200.

As described above, in the semiconductor device 200 according to another embodiment and the fabricating method thereof, a chip size package can be realized in a simplified manner, and sizes (widths) of the conductive patterns 240 can be accurately controlled.

Figure 6:
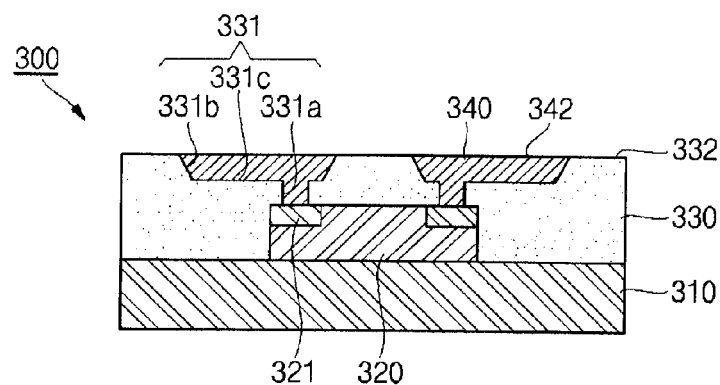
FIG. 6 is a cross-sectional view of a semiconductor device according to still another embodiment.

Referring to FIG. 6, a cross-sectional view of a semiconductor device 300 according to still another embodiment is illustrated.

As illustrated in FIG. 6, the semiconductor device 300 according to still another embodiment includes a dummy wafer 310, a semiconductor die 320, a dielectric 330 and conductive patterns 340.

The dummy wafer 310 may be a functionless wafer. The dummy wafer 310 has the same coefficient of thermal expansion as that of the semiconductor die 320. Thus, during operation of the semiconductor device 300, the semiconductor die 320 is not peeled off from the dummy wafer 310. Of course, in addition to the functionless wafer, glass, ceramic, or an equivalent thereof having substantially the same coefficient of thermal expansion as that of the semiconductor die 320 may be used as the dummy wafer 310.

The semiconductor die 320 may be formed on the dummy wafer 310. In this embodiment, the bottom, e.g., second, surface of the semiconductor die 320 is mounted to the top, e.g., first, surface of the dummy wafer 310. In addition, the semiconductor die 320 includes a plurality of bond pads 321 on the top, e.g., first, surface thereof. In one embodiment, the bond pads 321 are derived from a redistribution layer formed on the top surface of the semiconductor die 320.

The dielectric 330 surrounds the semiconductor die 320 and the dummy wafer 310. That is to say, the dielectric 330 surrounds not only lateral and top surfaces of the semiconductor die 320 but also the top surface of the dummy wafer 310 corresponding to an outer periphery of the semiconductor die 320. The dielectric 330 may be at least one selected from the group consisting of phenolic resin, polyimide (PI), benzocyclobutene (BCB), polybenzoxazole (PBO), epoxy, and equivalents thereof, but aspects of the present embodiment are not limited thereto in view of the material of the dielectric 330. Here, openings 331 are formed in the dielectric 330. The openings 331 include first openings 331a formed at positions at which they overlap with the bond pads 321, second openings 331b led from the first openings 331a and formed to have diameters larger than those of the first openings 331a and to be slanted, and a bottom, e.g., first, surface 331c formed between the first openings 331a and the second openings 331b to be planar.

The conductive patterns 340 are plated on the bond pads 321 and are mounted in the openings 331 of the dielectric 330 at the same time. That is to say, the conductive patterns 340 are formed in the first openings 331a, the second openings 331b and on the bottom surface 331c. In addition, a top, e.g., first, surface 342 of the conductive patterns 340 and a top, e.g., first, surface 332 of the dielectric 330 are coplanar.

Referring to FIGS. 7A through 7E, cross-sectional views illustrating a fabricating method of the semiconductor device 300 illustrated in FIG. 6 are illustrated.

As illustrated in FIGS. 7A through 7E, the fabricating method of the semiconductor device 300 includes operations of mounting semiconductor dies, forming a dielectric, plating a conductor, forming conductive patterns, and separating.

Figure 7A:
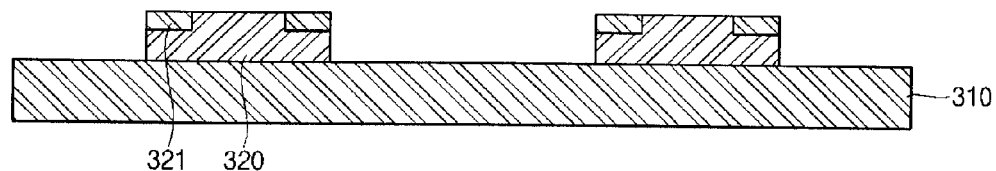
FIGS. 7A, 7B, 7C, 7D, 7E are cross-sectional views illustrating a fabricating method of the semiconductor device illustrated in FIG. 6.

As illustrated in FIG. 7A, in the operation of mounting semiconductor dies, a plurality of semiconductor dies 320 each having bond pads 321 are mounted on a dummy wafer 310. Here, the semiconductor dies 320 are mounted on the dummy wafer 310 such that the bond pads 321 face upward. In addition, an adhesive may further be interposed between the semiconductor dies 320 and the dummy wafer 310.

Figure 7B:
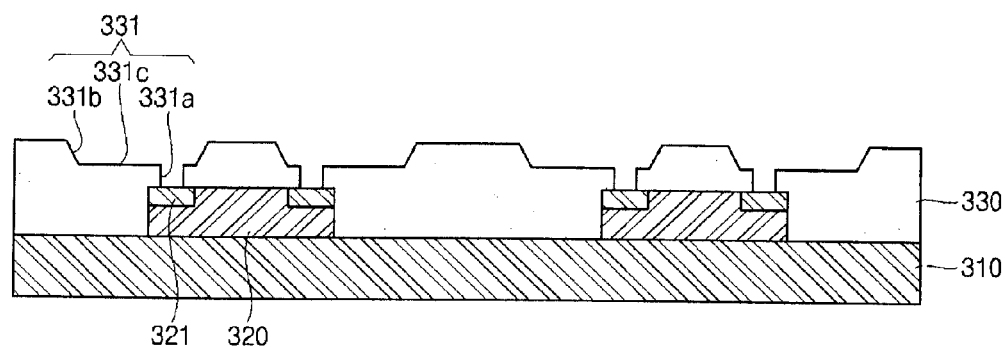

As illustrated in FIG. 7B, in the operation of forming a dielectric, a dielectric 330 having a predetermined pattern is formed on the dummy wafer 310 and the plurality of semiconductor dies 320. Here, openings 331 through which the bond pads 321 are exposed upward are formed in the dielectric 330. The openings 331 include first openings 331a, second openings 331b and a bottom surface 331c. The first openings 331a are formed at positions corresponding to the bond pads 321. The second openings 331b are connected to the first openings 331a and are formed to have diameters larger than those of the first openings 331a. In addition, the second openings 331b are formed to slant. Further, the bottom surface 331c formed between the first openings 331a and the second openings 331b is planar. Here, the dielectric 330 may be at least one selected from the group consisting of phenolic resin, polyimide (PI), benzocyclobutene (BCB), polybenzoxazole (PBO), epoxy, and equivalents thereof, but aspects of the present embodiment are not limited thereto in view of the material of the dielectric 330.

Figure 7C:
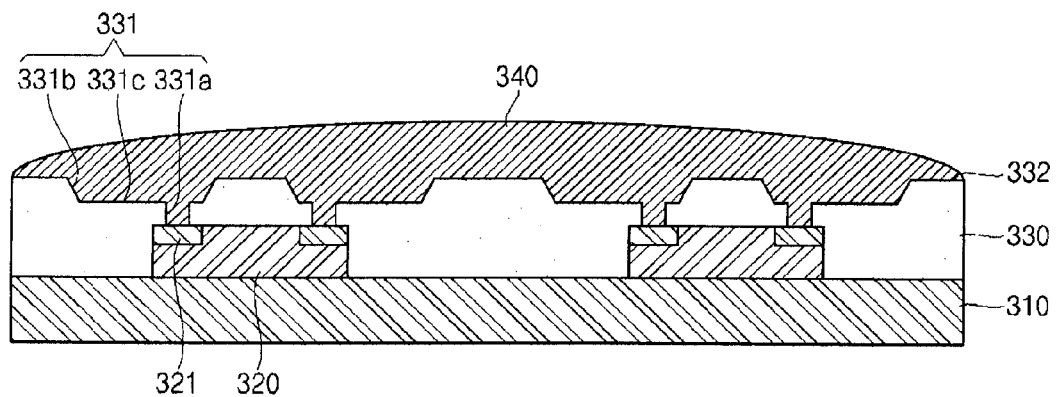

As illustrated in FIG. 7C, in the operation of plating a conductor, a conductor 340 having a predetermined thickness is plated on the semiconductor dies 320 and the dielectric 330. In such a manner, the conductor 340 is plated on the bond pads 321 of the semiconductor dies 320 and the openings 331 of the dielectric 330 to form conductive vias. Here, the conductor 340 is formed thickly enough to cover the dielectric 330.

Figure 7D:
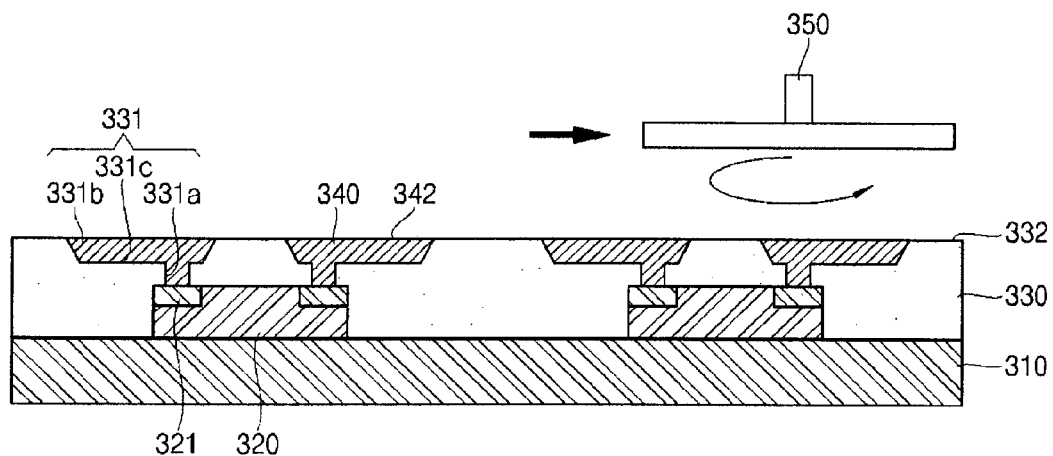

As illustrated in FIG. 7D, in the operation of forming conductive patterns, the conductor 340 formed on the dielectric 330 is subjected to grinding using a grinding tool 350, thereby removing unnecessary portions of the conductor 340. Finally, the conductive patterns 340 connected to the bond pads 321 and positioned in the openings 331 of the dielectric 330 are formed in the operation of grinding. Here, the second openings 331b of the openings 331 are formed to slant, thereby accurately controlling widths of the conductive patterns 340. That is to say, grinding amounts of the conductor 340 and the dielectric 330 can be controlled by adjusting a grinding depth of the grinding tool 350. Accordingly, the widths of the conductive patterns 340 exposed through the second openings 331b can be controlled. Accordingly, the widths of the conductive patterns 340 exposed through the second openings 331b can be controlled. For example, when the grinding depth by the grinding tool 350 is relatively small, the widths of the conductive patterns 340 become increased. On the other hand, when the grinding depth by the grinding tool 350 is relatively large, the widths of the conductive patterns 340 are reduced.

Figure 7E:
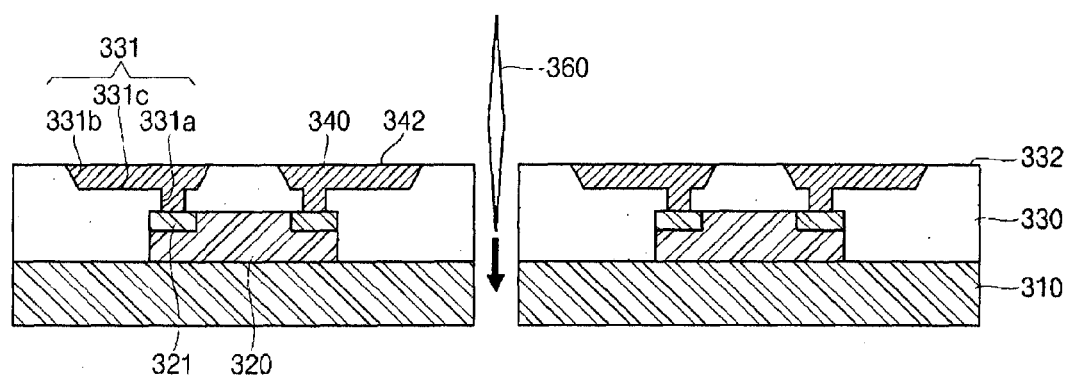

As illustrated in FIG. 7E, in the operation of separating, the dielectric 330 and the dummy wafer 310 are cut by sawing using a sawing tool 360, thereby separating into the single semiconductor devices 300.

As described above, in the semiconductor device 300 according to still another embodiment and the fabricating method thereof, sizes (widths) of the conductive patterns 340 can be accurately controlled.

In addition, since the dummy wafer 310 is attached to the semiconductor dies 320, dissipation efficiency of the semiconductor dies 320 is improved.

Further, since the dummy wafer 310 having the same coefficient of thermal expansion as that of the semiconductor dies 320, the semiconductor dies 320 are not peeled off from the dummy wafer 310 during operation of the semiconductor device 300.

Although specific embodiments were described herein, the scope of the invention is not limited to those specific embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor device comprising:
   a semiconductor die comprising a first surface comprising a bond pad;
   a dielectric directly covering at least the first surface of the semiconductor die, wherein the bond pad is exposed to the outside through an opening in the dielectric, the opening comprising:
      a first opening formed at a position corresponding to the bond pad;
      a second opening coupled to the first opening and having a diameter larger than the first opening; and
      a first surface of the dielectric between the first opening and the second opening; and
   a conductive pattern plated on the bond pad and filling the opening of the dielectric, wherein a first surface of the conductive pattern and a first exposed outer surface of the dielectric are coplanar.

2. The semiconductor device of claim 1 further comprising an encapsulant encapsulating the semiconductor die.

3. The semiconductor device of claim 2 wherein the encapsulant encapsulates a second surface and lateral surfaces of the semiconductor die and exposes the first surface of the semiconductor die.

4. The semiconductor device of claim 3 wherein a first surface of the encapsulant and the first surface of the semiconductor die are coplanar.

5. The semiconductor device of claim 4 wherein the dielectric encloses the first surface of the encapsulant and the first surface of the semiconductor die.

6. The semiconductor device of claim 1 wherein the second opening is slanted.

7. The semiconductor device of claim 1 wherein the conductive pattern comprises:
   a via region coupled to the bond pad;
   a land region; and
   a connecting region coupling the via region to the land region.

8. The semiconductor device of claim 1 further comprising a dummy wafer comprising a first surface, a second surface of the semiconductor die being coupled to the first surface of the dummy wafer.

9. The semiconductor device of claim 8 wherein the dielectric encloses lateral surfaces of the semiconductor die and the first surface of the dummy wafer.

10. A semiconductor device comprising:
    a semiconductor die comprising a first surface comprising a bond pad;
    a dielectric directly covering at least the first surface of the semiconductor die, wherein the bond pad is exposed to the outside through an opening in the dielectric, the opening comprising:
    a first opening formed at a position corresponding to the bond pad;
    a second opening coupled to the first opening and having a diameter larger than the first opening; and
    a first surface of the dielectric between the first opening and the second opening; and
    a conductive pattern filling the opening of the dielectric, wherein a first surface of the conductive pattern and a first exposed outer surface of the dielectric are coplanar.

11. The semiconductor device of claim 10 wherein the second opening is slanted.

12. The semiconductor device of claim 10 wherein the second opening is non-perpendicular to the first exposed outer surface of the dielectric.

13. The semiconductor device of claim 10 wherein the first surface of the opening is planar.

14. A semiconductor device comprising:
    a semiconductor die comprising a first surface comprising a bond pad;
    a dielectric directly covering at least the first surface of the semiconductor die;
    a conductive pattern in an opening of the dielectric, wherein a first surface of the conductive pattern and a first exposed outer surface of the dielectric are coplanar, the conductive pattern comprising:
    a via region connected to the bond pad;
    a land region having a diameter larger than the via region; and
    a connecting region connecting the via region and the land region.

15. The semiconductor device of claim 14, wherein the opening comprises:
    a first opening formed at a position corresponding to the bond pad;
    a second opening coupled to the first opening and having a diameter larger than the first opening; and
    a first surface of the dielectric between the first opening and the second opening.

16. The semiconductor device of claim 15 wherein the via region is within the first opening.

17. The semiconductor device of claim 15 wherein the land region is within the second opening.

18. The semiconductor device of claim 15 wherein the connecting region is on the first surface of the opening.

* * * * *